United States Patent [19]
Britton et al.

[11] Patent Number: 5,394,031
[45] Date of Patent: Feb. 28, 1995

[54] APPARATUS AND METHOD TO IMPROVE PROGRAMMING SPEED OF FIELD PROGRAMMABLE GATE ARRAYS

[75] Inventors: Barry K. Britton, Schnecksville; Wai-Bor Leung, Wescosville, both of Pa.

[73] Assignee: AT&T Corp., Murray Hill, N.J.

[21] Appl. No.: 163,952

[22] Filed: Dec. 8, 1993

[51] Int. Cl.$^6$ ............................................. H03K 19/173
[52] U.S. Cl. ................................. 326/38; 340/825.83; 341/51; 326/37
[58] Field of Search ................................ 307/465–469; 340/825.83; 341/51; 377/64, 70, 73

[56] References Cited

U.S. PATENT DOCUMENTS

| | | | |
|---|---|---|---|
| 4,377,757 | 3/1983 | Konemonn | 307/465 |
| 4,670,749 | 6/1987 | Freeman | 307/465 |
| 4,935,737 | 6/1990 | Izbicki | 340/825.83 |
| 5,256,918 | 10/1993 | Suzuki | 307/465 |
| 5,329,179 | 7/1994 | Tang | 307/465 |

*Primary Examiner*—Edward P. Westin
*Assistant Examiner*—Andrew Sanders

[57] ABSTRACT

Apparatus and method for compressing configuration bitstreams used to program Field Programmable Gate Arrays (FPGAs) and for decreasing the amount of time necessary to configure FPGAs. In a first embodiment of the present invention, a shift register is employed that enables data bits to be shifted multiple positions per clock cycle through the shift register. As a result, the amount of time required to shift the data bits through the shift register can be reduced by 1/N, where N is the number of positions per clock cycle. The shift register also permits the option of shifting bits through the shift register one bit per clock cycle. In a second embodiment of the present invention, control and address bits are employed to more efficiently manage and reduce the size of the configuration bitstream. Accordingly, one embodiment provides the option of loading data into the array of the FPGA by address column in a non-sequential fashion. In other words, to streamline loading of data into the array from the data shift register, the present invention permits non-sequential writing of frames into the array by column address. Another preferred embodiment of the present invention, permits a previous frame of data (repetitive data) to be loaded into the array without having to resupply the data shift register with the repetitive data. Simple logic control bits indicate how frames of data are to be managed.

9 Claims, 9 Drawing Sheets

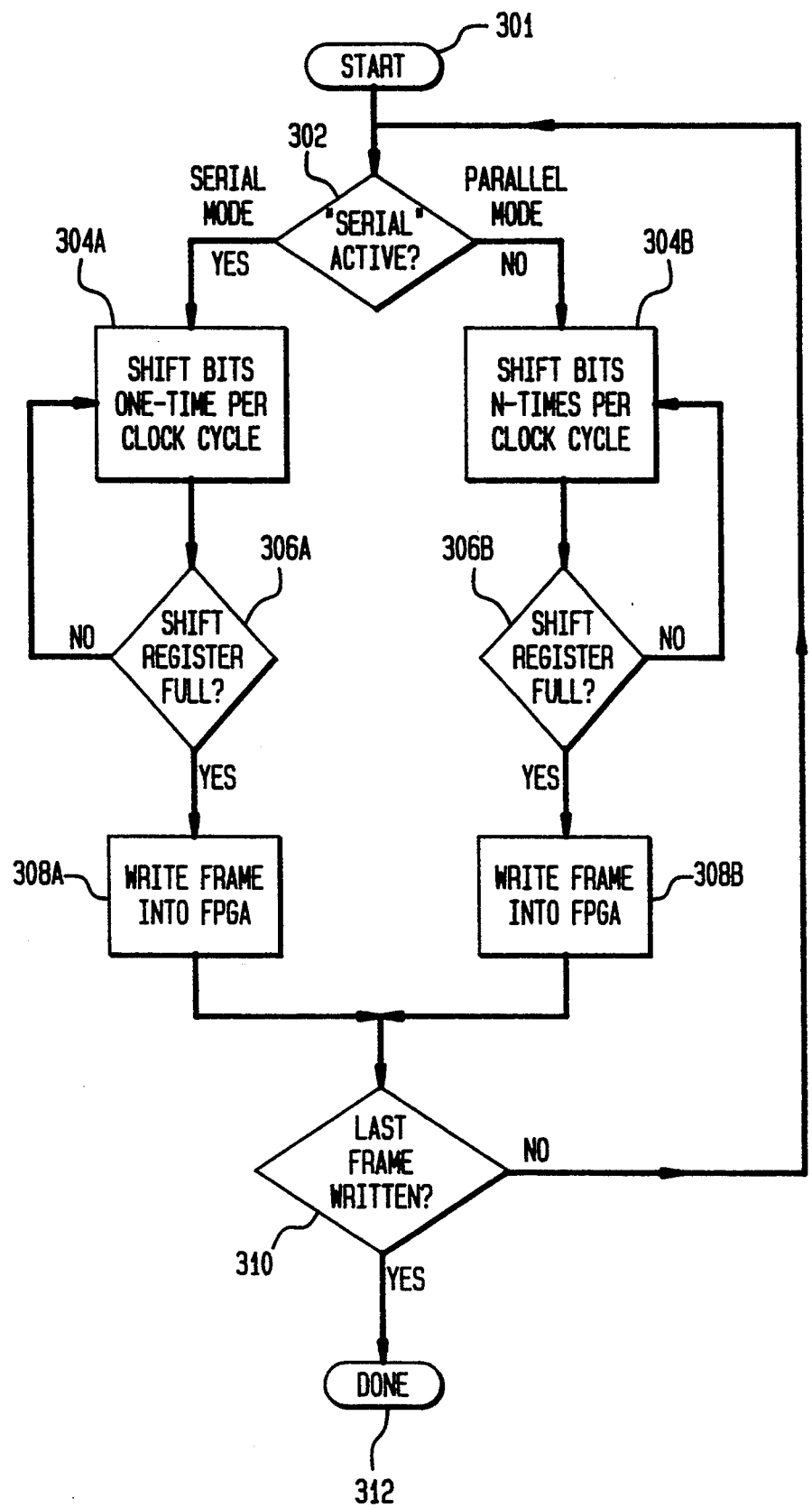

FIG. 4A
(SERIAL MODE)

|    | INIT. | CYCLE 1 | CYCLE 2 | CYCLE 3 | CYCLE 4 | CYCLE 5 | CYCLE 6 |
|----|-------|---------|---------|---------|---------|---------|---------|
| Q0 | X     | BIT 0   | BIT 1   | BIT 2   | BIT 3   | BIT 4   | BIT 5   |
| Q1 | X     | X       | BIT 0   | BIT 1   | BIT 2   | BIT 3   | BIT 4   |
| Q2 | X     | X       | X       | BIT 0   | BIT 1   | BIT 2   | BIT 3   |
| Q3 | X     | X       | X       | X       | BIT 0   | BIT 1   | BIT 2   |
| Q4 | X     | X       | X       | X       | X       | BIT 0   | BIT 1   |
| Q5 | X     | X       | X       | X       | X       | X       | BIT 0   |

FIG. 4B
(PARALLEL MODE)

|    | INIT. | CYCLE 1 | CYCLE 2 | CYCLE 3 |
|----|-------|---------|---------|---------|
| Q0 | X     | BIT 1   | BIT 3   | BIT 5   |
| Q1 | X     | BIT 0   | BIT 2   | BIT 4   |
| Q2 | X     | X       | BIT 1   | BIT 3   |
| Q3 | X     | X       | BIT 0   | BIT 2   |
| Q4 | X     | X       | X       | BIT 1   |
| Q5 | X     | X       | X       | BIT 0   |

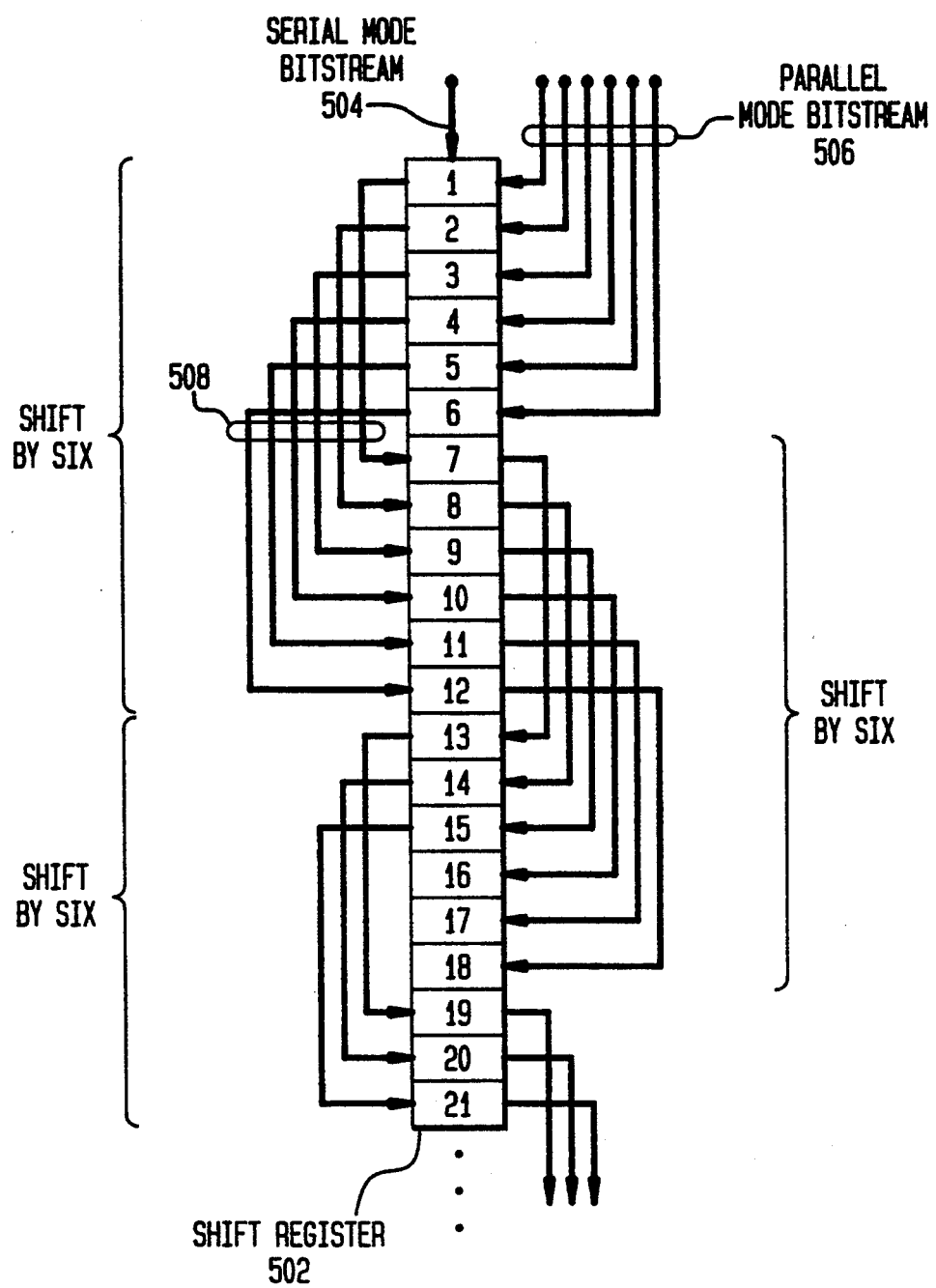

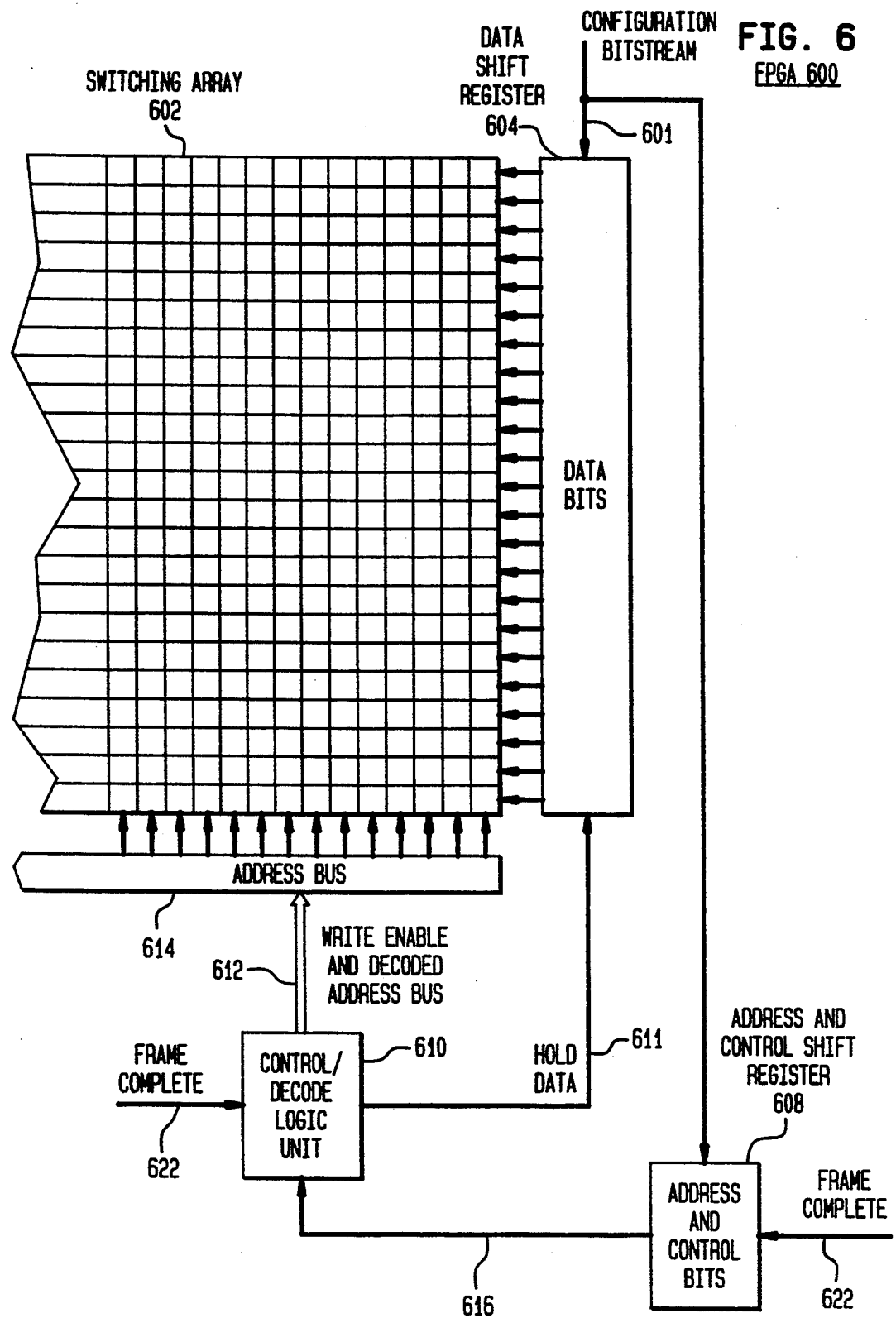

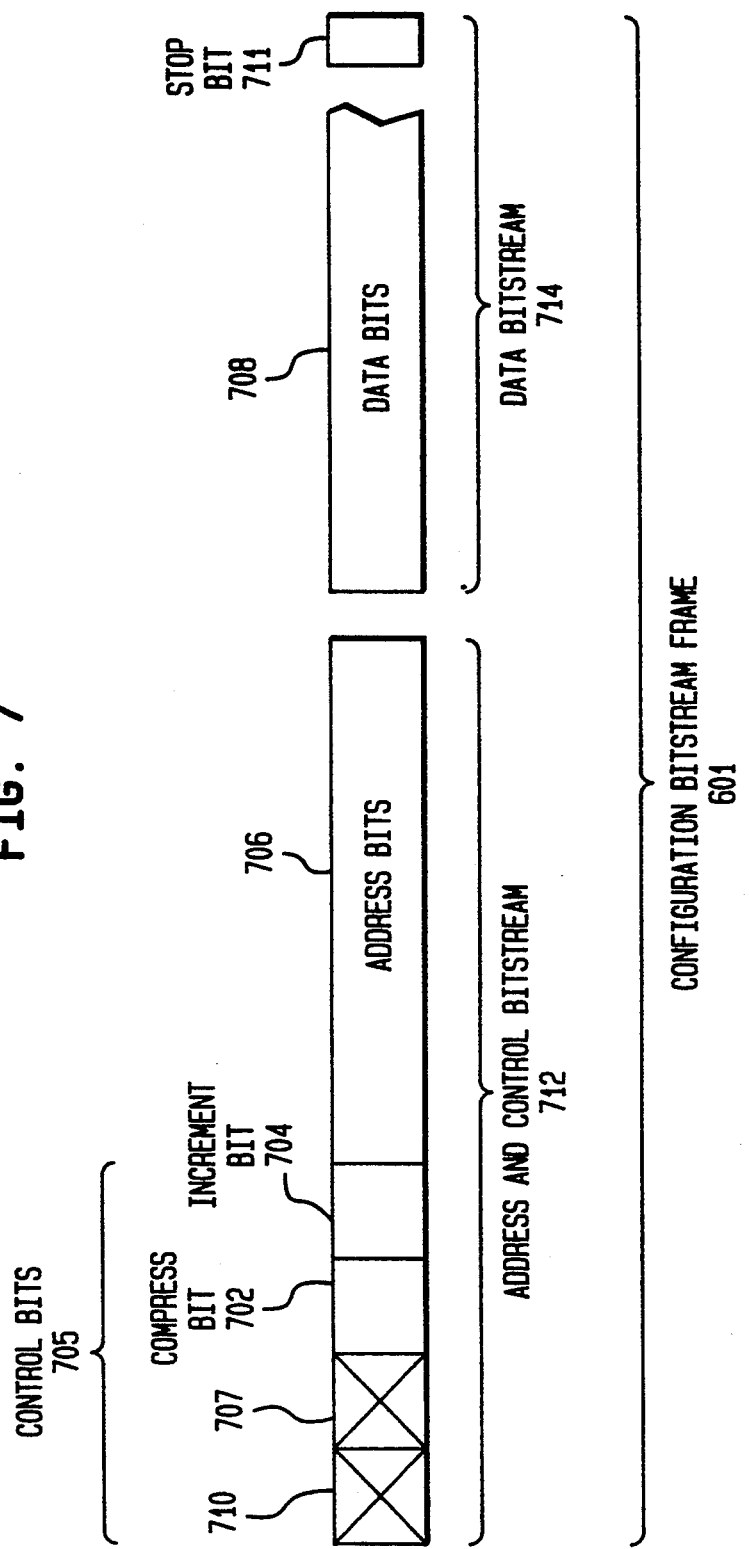

APPARATUS AND METHOD TO IMPROVE PROGRAMMING SPEED OF FIELD PROGRAMMABLE GATE ARRAYS

BACKGROUND OF THE INVENTION

1. Field of the Invention

The present invention relates generally to Field Programmable Gate Arrays (FPGAs). More particularly, the present invention relates to an apparatus and method for compressing data streams used to program FPGAs and for decreasing the amount of time necessary to configure FPGAs.

2. Related Art

In Field Programmable Gate Arrays (FPGAs), Resource Routing Nodes (R-Nodes) are used to connect logic elements of the FPGAs, which may also be configurable, through Configurable Interconnect Points (CIPs). To implement a desired circuit, the FPGA must be given the information as to what connections are to be made and/or what logic is to be implemented. This is generally accomplished by employing a "configuration bitstream," which is an ordered data stream in which each bit is represented by a binary value (e.g., logic 1 or logic 0).

The configuration bitstream is generally used to configure (i.e., program) switches inside the FPGA to a desired state, (e.g., on or off). These switches can be implemented from RAM cells which control pass transistors, antifuse connection points, fuse connection points, or any other type of switch implementation. These switches are then used to control the configurable routing or logic on the FPGA.

The switches in an FPGA are typically arranged in a M row by N column matrix (array). Therefore, the bitstream is generally broken up into "frames," where each frame contains control bits along with data needed to write to one column of the array.

FIG. 1 shows a simplified block diagram illustrating how current FPGAs are generally programmed. Data bits (configuration bitstream 101) are shifted through a data shift register 102 one bit at a time per clock cycle. Data bits are shifted until the data bits align with the appropriate row, at which time the appropriate column of switches is written to by enabling the column's address line 108, 110, or 112. Thus, one frame of data is used to program one column of switches, followed by the next frame of data used to program the next consecutive column of switches (usually loaded from left to right starting with column 0 in FIG. 1). This is continued until all columns of switches have been set appropriately. Thus, for the entire FPGA, there is a corresponding set of data bits in the configuration bitstream 101 for each switch to be set.

As the size (usable gate count) of FPGAs increasingly become larger, the number of switches in an FPGA will increase appreciably. As a consequence the configuration bitstream becomes larger, making the configuration bitstream difficult to manage and store. For example, an FPGA with 15,000 usuable gates requires a bit stream of 192,000 bits. Therefore, what is needed is a methodology to reduce the size of the bit stream.

Another problem associated with configuring FPGAs is the amount of time it takes to configure (program) the FPGA. In current FPGA designs one frame of data bits is shifted through the data shift register one bit per clock cycle. Thus, the amount of time it takes to configure the FPGA can be considerable, especially during device testing where it is common to reconfigure the FPGA many times. Therefore, what is needed is a methodology to speed-up the time it takes to configure FPGAs.

SUMMARY OF THE INVENTION

The present invention is directed to an apparatus and method for compressing the size of configuration bitstreams used to program Field Programmable Gate Arrays (FPGAs) and for decreasing the amount of time necessary to configure FPGAs. In a first embodiment of the present invention, a shift register is employed that enables data bits to be shifted multiple positions per clock cycle through the shift register. As a result, the amount of time required to shift the data bits through the shift register can be reduced by 1/N, where N is the number of positions per clock cycle. The shift register also supports the option of shifting bits through the shift register one bit per clock cycle.

In a second embodiment of the present invention, control and address bits are employed to more efficiently manage and reduce the size of the configuration bitstream. Accordingly, one embodiment provides the option of loading data into the array (e.g., matrix) of the FPGA by addressing columns in a non-sequential fashion. In other words, to streamline loading of data into the array from the data shift register, the present invention permits non-sequential writing of frames into the array by column address. Another preferred embodiment of the present invention, permits a previous frame of data (repetitive data) to be loaded into the array without having to resupply the data shift register with the repetitive data. Simple logic control bits indicate how frames of data are to be managed.

Thus, one advantage of the present invention is that data bits in configuration frames can be used to set more than one column of switches.

Another advantage of the present invention is that a column address can be supplied in the bitstream to indicate to the FPGA which column of the array is to receive the current frame. If the next address is a sequential increment from the previous address, an address "increment" bit can be used, further reducing the configuration bitstream.

A further advantage of the present invention is that when the data shift register permits data bits to be shifted multiple positions per clock cycle, then the amount of time required to shift the data bits through the shift register can be reduced by 1/N, where N is the number of positions per clock cycle (without increasing clock speed).

Further features and advantages of the present invention, as well as the structure and operation of various embodiments of the present invention, are described in detail below with reference to the accompanying drawings.

BRIEF DESCRIPTION OF THE FIGURES

FIG. 3 is a flow chart illustrating the operation of the data shift register shown in FIG. 2.

FIG. 4A is a chart illustrating how many cycles it takes a frame of configuration bitstream to be stored in a data shift register when in serial mode.

FIG. 4B is a chart illustrating how many cycles it takes a frame of configuration bitstream to be stored in a data shift register when in parallel mode.

FIG. 5 is a simplified block diagram of a shift register in parallel mode that operates six-times as fast as conventional shift registers.

FIG. 6 is a simplified block diagram of an FPGA 600 according to one embodiment of the present invention.

FIG. 7 shows a configuration bit stream and an example address/control bitstream according to the present invention.

Figure 1:
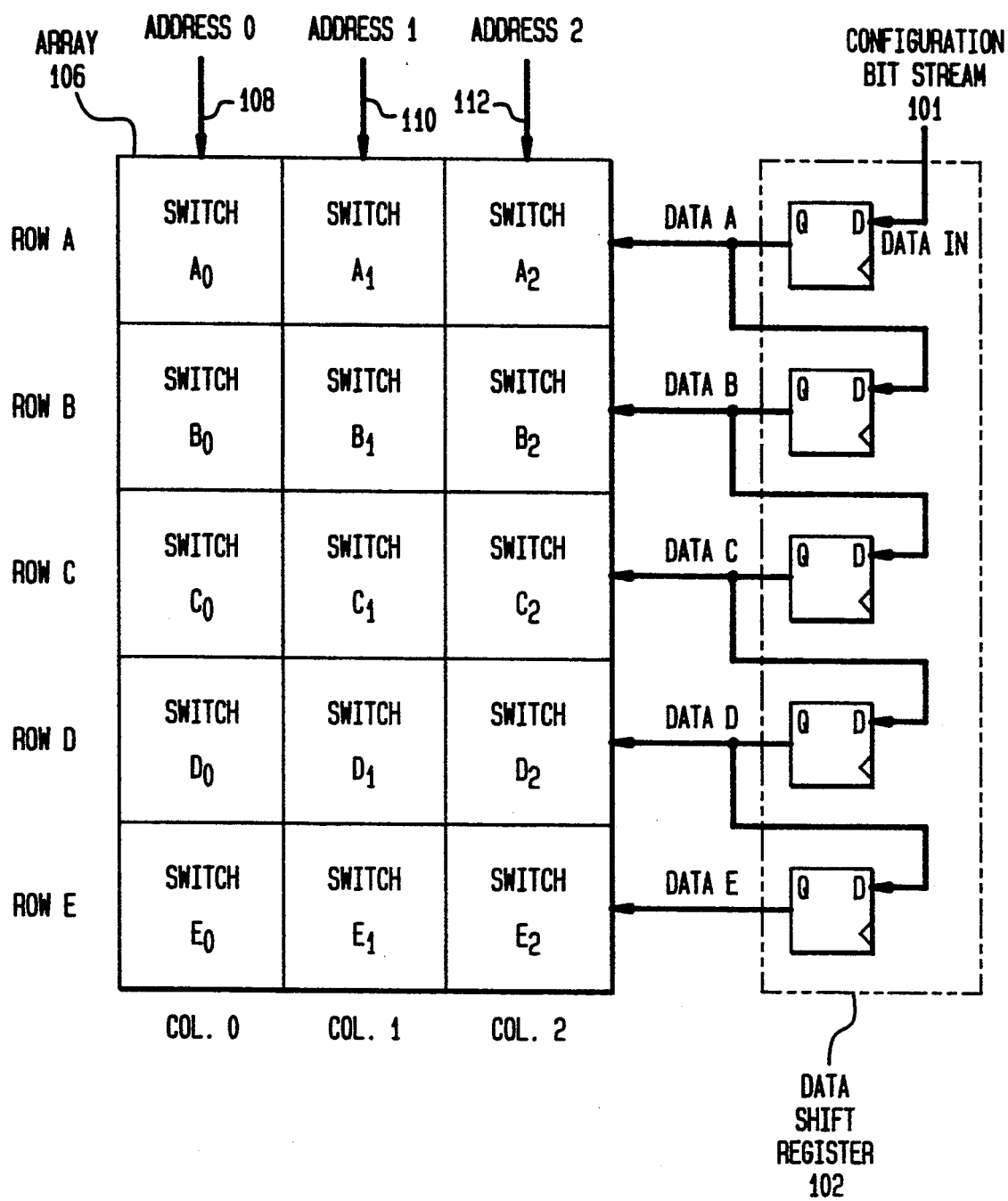
FIG. 1 shows a simplified block diagram illustrating how current FPGAs are generally programmed.

DETAILED DESCRIPTION OF THE PREFERRED EMBODIMENTS 1.0 Improving Program Speed of Loading Configuration Data in FPGAs Without the Need to Increase the Clock Rate Currently, data bits are shifted through data shift registers one bit per clock cycle, as illustrated in FIG. 1. Attempts have been made to increase the speed of shift registers by increasing the clock speed. The present invention increases the speed of shift registers without the need to increase clock speed. The present invention improves programming speed of FPGAs by shifting data bits more than one position during each clock cycle (i.e., either during each rising edge of the clock or during each falling edge of the clock).

Figure 2:
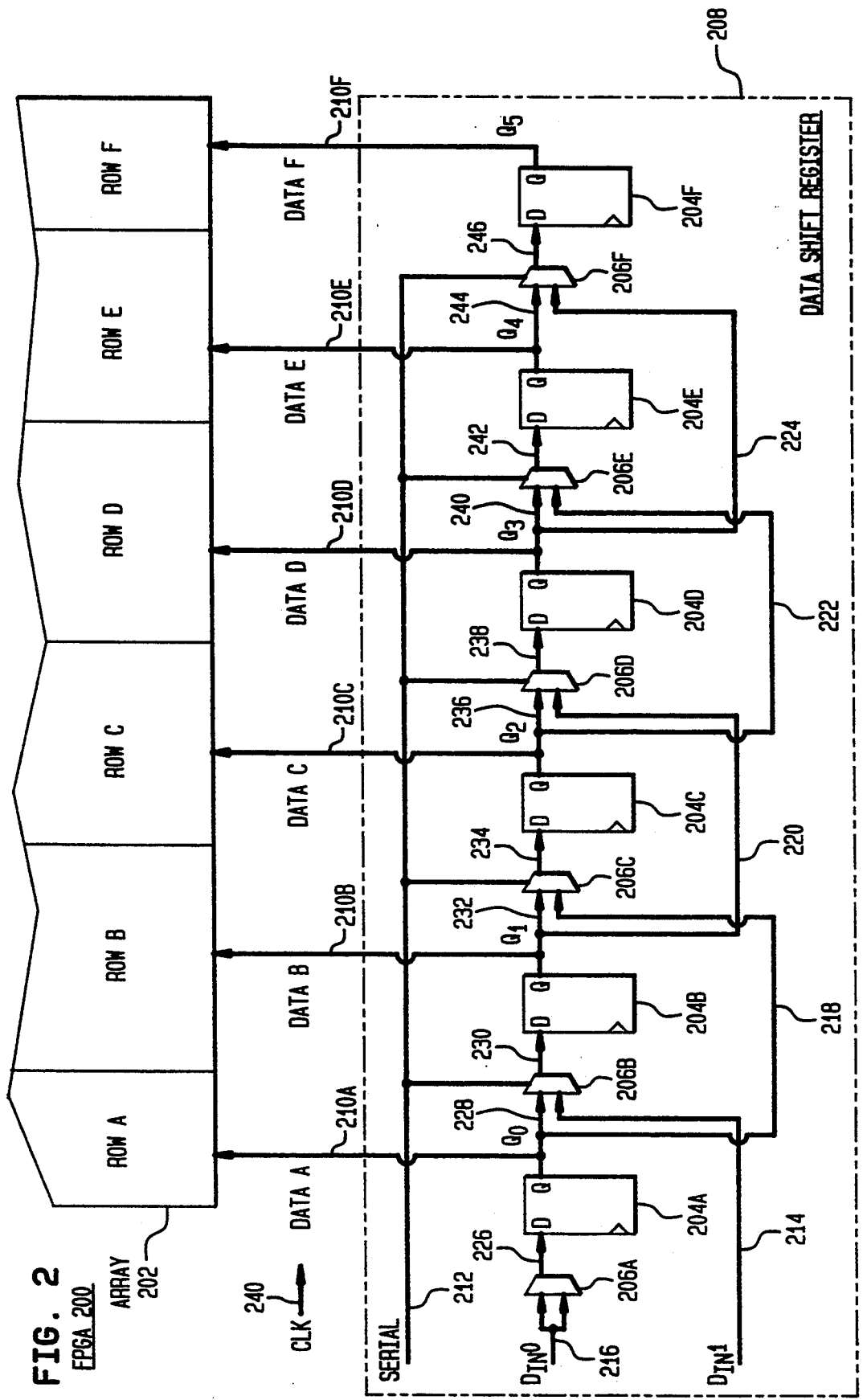
FIG. 2 is a simplified block diagram of a data shift register employed on a FPGA chip that is able to shift data bits more than one bit per clock cycle according to one embodiment of the present invention.

FIG. 2 illustrates a block diagram of a data shift register 208 which is able to shift more than one bit per clock cycle according to one embodiment of the present invention. In this example, data shift register 208 is a six bit shift register employing flip-flops 204A-F that can shift up to two bits per clock cycle when in a "parallel mode" or one bit per clock cycle when in a "serial mode."

In a preferred embodiment, flip-flops 204 are edge-triggered D-type flip-flops. Data is transferred to the Q output of each flip-flop 204 on the positive-going edge of a CLK input signal 240. However, flip-flops 204 may be any type of positive or negative edge triggered latches (or registers) that have the ability to store (or latch) the last value applied to their respective inputs.

A frame of data must enter data shift register 208 before it can be loaded into the switching array 202. A frame is a part of a configuration bit stream typically having the same number bits as the length of the shift register, which in this simplified example is six bits for data shift register 208, along with any necessary control bits. According to the present invention, a frame of data can either enter shift register 208 in serial mode (e.g., one bit per clock cycle) or in parallel mode (e.g., N-bits per clock cycle, where N is any integer greater than 1). The operation of data shift register 208 of FIG. 2 will be illustrated with reference to the operational flow chart of FIG. 3.

Referring to FIG. 3, in decisional step 302, shift register 208 will operate in serial mode when "SERIAL" signal 212 is active (e.g. logic 1 in the preferred embodiment) or shift register 208 will operate in parallel mode when SERIAL 212 signal is inactive (logic 0). The SERIAL signal 212 can come from any logic source such as a control (not shown) logic circuit located on the FPGA chip 200 or from control bits as part of the configuration bit stream.

When SERIAL signal 212 is a logic 1 data shift register 208 operates in Serial Mode as indicated by the YES branch of decisional block 302, where serial mode is active. In serial mode, shift register 208 operates as a conventional shift register. Thus, an entire frame of configuration bit stream enters data shift register 208 via input terminal 216 (Din 0) and each bit of the frame advances one-time per clock cycle.

Referring to FIG. 2, while in the serial mode an active serial signal 212 causes multiplexers 206 to select data from upper input terminals 228, 232 236, 240, and 244 of multipliers 206B-F, respectively. For example, a first bit of a frame to enter shift register 208 will enter flip-flop 204A through path 216, 226. On a next clock cycle, the bit will pass from flip-flop 204A to flip-flop 204B via paths 228, 230. On a next clock cycle, the bit will pass from flip-flop 204B to 204C via paths 232, 234. All subsequent bits of the frame will follow the same path until the shift register 208 is full (e.g., an entire frame has been loaded into data shift register 208). Step 304A in FIG. 3 represents one bit shift through the data shift register 208.

Referring to FIG. 3, in decisional step 306A, if the shift register 208 is full, then according to step 308A the frame of data (DATA A-F) is written in parallel from shift register 208 into Rows A-F of switching array 202 via signals (on wires) 210A-F, respectively. Writing occurs when the address column enable line (not shown) is enabled by a computer (not shown) or a control unit (not shown).

Once the frame has been written into the array 202, the decisional block 310 is used to determine if the last needed frame has been written. If so, the YES branch of block 310 is taken to the DONE block 312 and no more frames are written. If not, the NO branch of block 310 is taken and the operation of loading the shift register 208 repeats, returning to decisional step 302. If, in step 306A, it is determined that the shift register 208 is not full, then control returns to step 304A to perform another one bit data shift through the data shift register 208.

If SERIAL signal 216 is not active (logic 0) then shift register 208 operates in parallel mode according to present invention. In parallel mode, data will enter the shift register 208 N-times faster than in serial mode. Referring to FIG. 2, shift register 208 is two-times faster than a serial shift register when in parallel mode. Thus, an entire frame of configuration bit stream will enter data shift register 208, whereby each bit of the frame will advance two bit positions per clock cycle, as opposed to one.

Referring to FIG. 2, while in parallel mode an inactive serial signal 212 causes multiplexers 206 B-F to select data from lower input terminals 214, 218, 220, 222, and 224, respectively. For example, a first bit of a frame to enter shift register 208 will enter flip flop 204B through path 214. On a next clock cycle, the first bit will pass from flip-flop 204B to flip-flop 204D via path 220. On a next clock cycle the first bit will pass from flip-flop 204D to 204F via path 224.

On the other hand, the second bit will enter flip-flop 204A on the same clock cycle as the first bit enters flip 204B. On the next clock cycle, the second bit enters flip flop 204C via path 218. On the next clock cycle, the second bit enters flip-flop 204E via path 222 at the same time the first bit entered flip-flop 204F. At this time, data shift register 208 is full.

Referring to FIG. 3, in decisional step 306B, if the shift register 208 is full, then according to step 308B the frame (DATA A-F) is written into FPGA 202 as in step 306A explained above. Step 304B of FIG. 3 represents one shift iteration. If, in step 306B, if it is determined that the shift register 208 is not full, then control returns to step 304B to perform another data shift iteration. It should be noted that routing of data bits to data input Din 0 and Din 1 is selected using "SERIAL" as these bits are always connected.

When shift register 208 operates in serial mode, it takes six clock cycles for one frame to align with a corresponding row of the FPGA 202 for a six bit example as shown in FIG. 4A. When shift register 208 operates in parallel mode, it only takes three clock cycles to complete loading one frame of data, as shown in FIG. 4B. Thus, for a shift by two example for N (where N=2), the parallel mode is twice as fast the serial mode (prior art). Thus, the present invention is at a minimum twice as fast as conventional FPGAs, which only have the option of employing a serial transfer of bits.

FIG. 5 shows a simplified block diagram of a shift register 502 that operates six-times as fast conventional shift registers employed in current FPGAs. Shift register 502 shifts six times per clock cycle when in parallel mode and shifts one time per clock cycle when in serial mode. Six input wires, shown as 506, are employed to load data from the data source (not shown) to registers 1-6 in the data shift register 502. On the next clock cycle, data in registers 1-6 is transferred to registers 7-12, respectively, via paths 508. This process continues, as with a shift by two example explained above with reference to FIG. 2. In the serial mode of operation the configuration bit stream enters shift register 502 via path 504 as is apparent to those skilled in the art.

In the preferred embodiment, a shift by eight register is employed when in parallel mode which is eight-times faster than conventional FPGA shift registers. Although it is possible to employ shift registers in FPGAs that can employ greater than eight the number of bits that can be shifted per clock cycle, shift by eight registers are preferred because they require fewer interconnections at a justified cost savings in terms of speed.

2.0 Compression of Configuration Bitstream

Referring to FIG. 1, typically frames are written into FPGA 106 in sequential fashion. For instance, once column A is loaded with data, it is customary for a counter (not shown) to increment by one to enable the next sequential column (e.g., column B) to be written to by the next available frame of data. Generally, current FPGAs do not allow the option of writing to columns in a non-sequential fashion. Additionally, it is quite common that multiple columns in the array 106 will contain identical frames of data. Current FPGAs 100 write all of the data bits for each new frame of data into the data shift register 102 regardless of the repetitive nature of the data from previous frames of data written. This is costly in terms of speed and efficiency.

According to the present invention, it is possible to load data into an array of a FPGA by addressing columns of the array in a non-sequential fashion. To streamline loading of data into the array from the data shift register, one preferred embodiment of the present invention permits non-sequential writing of frames into the array by column address. Another preferred embodiment of the present invention, permits a previous frame of data (repetitive data) to be loaded into the army without having to resupply the data shift register with the repetitive data.

FIG. 6 is a simplified block diagram of an FPGA 600 according to a preferred embodiment of the present invention. FPGA 600 includes a switching array 602, a data shift register 604, an address/control shift register 608 and a control/decode logic unit 610. The FPGA 600 of the present invention permits data to be written into columns of the array 602 in a non-sequential fashion. It is also possible to write data from the data shift register 604 to multiple columns of the array 602 without the need to repeat the loading of the data for repetitive frames into the data shift register 604.

In a preferred embodiment of the present invention, the configuration bitstream 601 is produced by a computer or any data source (not shown) and fed into the data shift register 604 as described above, such as in a serial fashion. Each corresponding frame of configuration bitstream 601 includes address and control bits. Each configuration bitstream frame is also fed into the address/control shift register 608 in either a serial or parallel fashion, as described above.

FIG. 7 shows an example configuration bitstream frame 601, containing both address and control bits 712 and data bits 714. The address/control bit stream 712 includes control bits 705, address bits 706 and stop bits 711. In a preferred embodiment of the present invention, there are four control bits 705 and 12 address bits 706 in the address/control bitstream 712, and 210 data bits in the data bitstream 714. The amount of bits in each bit stream may vary depending on the size of the switching array 602.

Since both the data shift register 604 and the address and control shift register 608 receive the entire configuration bitstream, the data shift register is forced to hold the data bits from the previous frame until the address and control bits can be decoded, as described below, using the HOLD signal 611. As the data bits are written into the data shift register 604, they are ignored by the address and control shift register 608 until the current frame is written into the switching array 602, as indicated by the frame complete signal 622. This frame complete signal is generated in the data shift register 604 by determining when the data bits line up to the switching array 602 properly. When the frame complete signal 622 is detected, the address and control register 608 then begins to look for the start of the next configuration frame.

The control bits 705 include a compress bit 702, an increment bit 704, a start bit 710, and an end of configuration bit 707. An active start bit 710 (that is, the start bit 710 is a logical "0" value) indicates the beginning of a new frame of configuration bits 601. A "0" on end of configuration bit 707 indicates all frames have been written. Bits 710 and 707 can be decoded by simple decode logic circuitry (e.g., a transistor switch to indicate whether the bit is active) as would be apparent to those skilled in the art. Such circuitry (not shown) is part of the control/decode logic unit 610 shown in FIG. 6. The following discussion pertains to compress bit 702 and increment bit 704.

The compress bit 702 indicates to the control/decode logic unit 610 whether to hold and reuse the data stored in data shift register 604 from a previous write cycle. The increment bit 704 indicates to the control/decode logic unit 610 whether to employ "increment mode" (increment bit=1) or "address mode" (increment bit="0") when writing data from the data shift register 604 to switching array 602. "Increment mode" refers to writing the data from shift register 604 to the next sequential column from the last frame written. "Address mode" refers to writing frames of data from shift register 604 to columns in array 602 according to the column address indicated by the address bits 706. Address bits 706 are not required if the increment bit is set, thus reducing the number of bits in the frame.

Figure 8A:
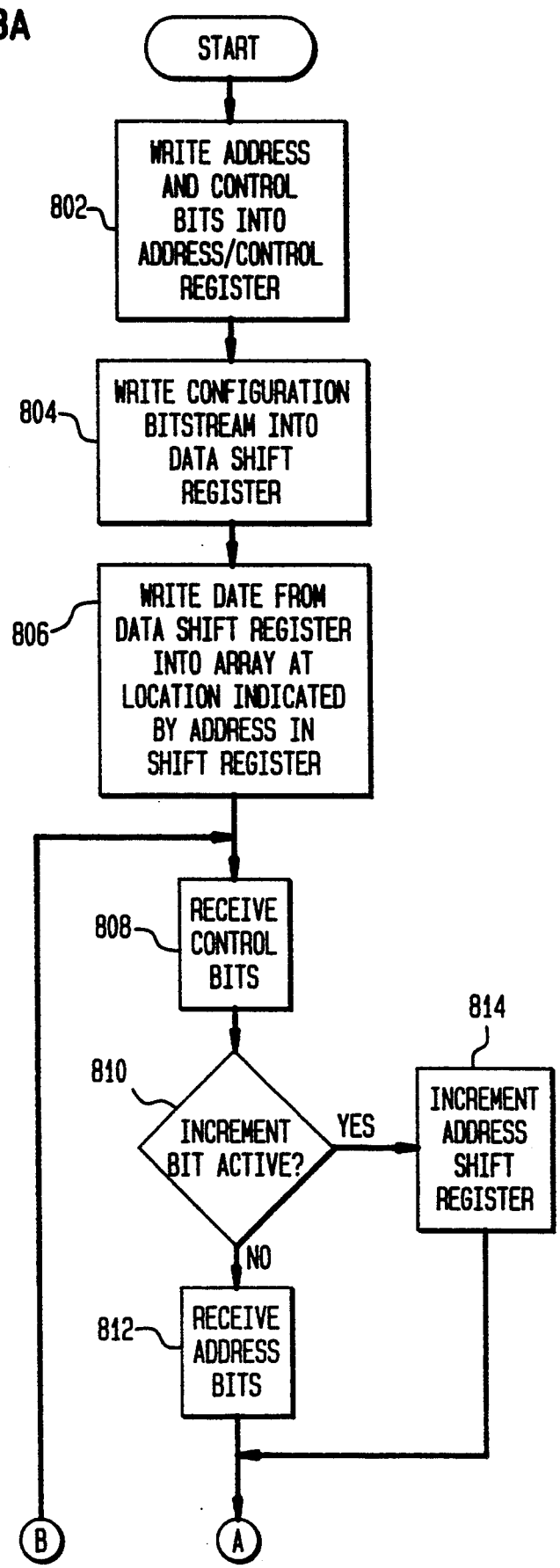
FIGS. 8A and 8B are flow charts illustrating the operation of FPGA 600 in accordance with one embodiment of the present invention.
Figure 8B:
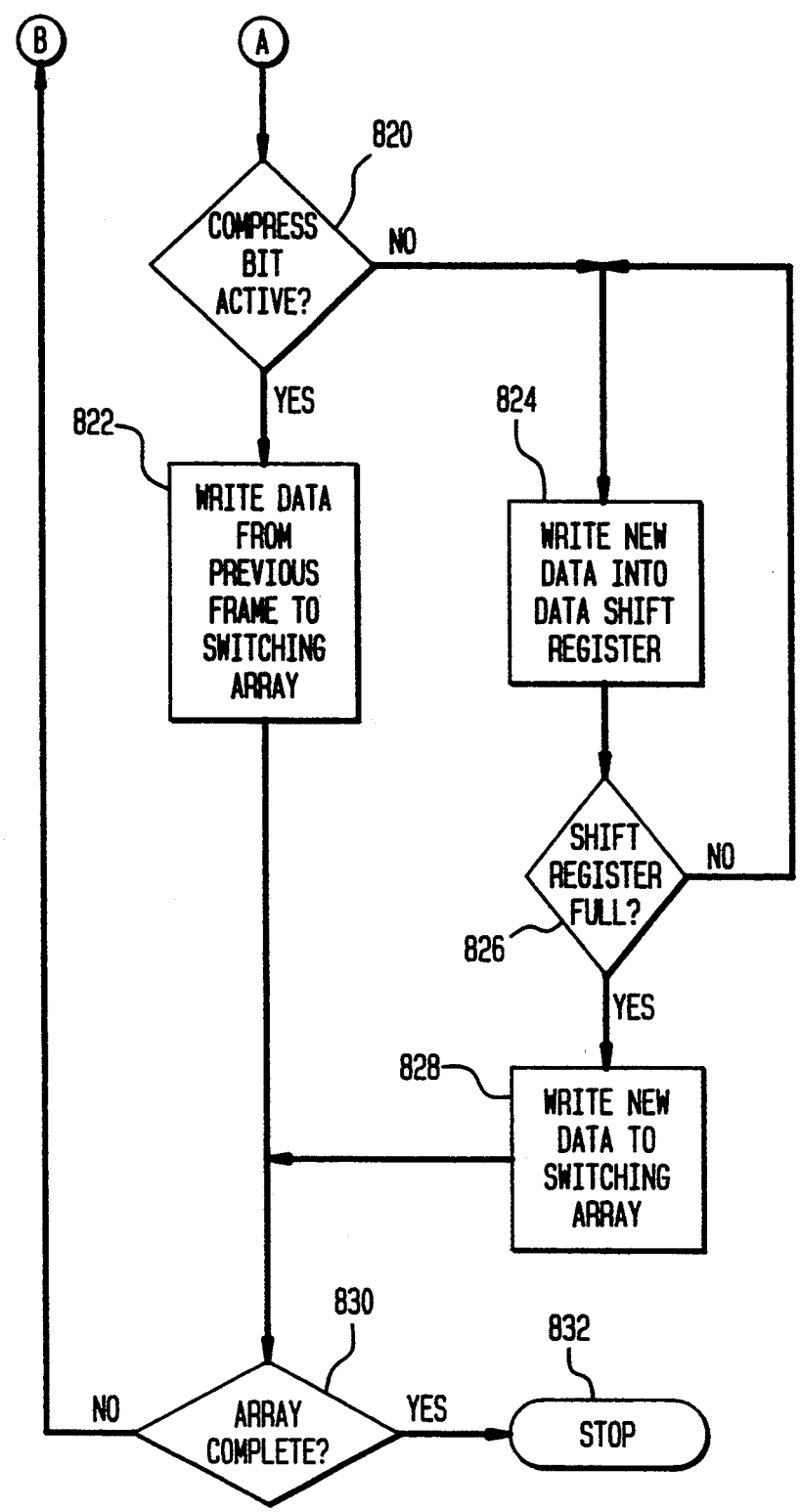

FIGS. 8A and 8B are flow charts illustrating the operation of FPGA 600 in accordance with a preferred embodiment of the present invention. The operational steps of FIGS. 8A and 8B will be described with reference to FIGS. 6 and 7. Steps 802–806 generally represent the operation of FPGA 600 at start-up. Steps 806–836 represent the operation of FPGA 600 after at least one frame of data is loaded into array 602.

Referring now to FIG. 8A, in step 802 the address-/control bits for the first frame of the configuration bitstream 601 is written into address and control shift register 608 from a data source (not shown).

In a step 804, the corresponding data bits of the first frame is written into data shift register 604 from a data source (not shown).

In a step 806, a frame of data bits from data shift register 604 is written into array 602 at a column address location indicated by address bits 706. Control/decode logic unit 610 receives the address bits 706 from the address/control shift register 608 via bus 616. Control/decode logic 610 passes the decoded address bits 706 to address bus 614 via bus 612. Once a complete frame of configuration data bits 601 is written into data shift register 604, control/decode logic unit receives an active frame complete signal 622. Upon receiving the frame complete signal 622, control/decode logic 610 activates a write enable signal via bus 612, which enables the writing of the particular column indicated by the address 706 active on address bus 614.

In step 808, control/decode logic unit 610 receives the control bits from the configuration bitstream 601. Control bits 705 are sent to control/decode logic unit 610 via bus 616. If increment bit 604 is active, the YES path from decision block 810 is selected and the address shift register value is incremented by one as in block 814. If the increment bit is not valid, the address bits are supplied in the configuration bitstream as in block 812. If compress bit 702 is not active (e.g., logic low "0" in the preferred embodiment), then data will have to be written into the data shift register 604 as indicated by the "NO" path of decisional step 820. The "NO" path includes steps 824, 826, and 828.

In step 824, a new frame of configuration data is written into shift register 604 until the shift register 604 becomes full, as indicated in decisional step 826 (FIG. 8B). Once the data shift operation becomes full, the new data is written to the switching array 602 as in block 828.

Referring again to step 820, if compress bit 702 is active (e.g., logic high "1" in the preferred embodiment), then new data does not need to be written into data shift register 604 according to the YES path of decisional step 810. According to the "YES" path of decisional step 810, data previously stored in data shift register 604 is held. This obviates the need to reload repetitive data frames of configuration bit stream 601, which reduces the size of the bit stream 601 and the amount of time to receive data in FPGA 600.

In step 822, the data from the previous frame in data shift register 604 is written into array 602 at a column location indicated by the address shift register 608. The writing of data from shift register 604 to switching array 602 is performed as described above.

The process repeats as indicated by the "NO" path of decisional step 830 until the array 602 is completely configured. Control bit 702 and increment bit 704 may be simultaneously processed by control/decode logic unit 610, or may be serially processed as shown in FIGS. 8A and 8B. However, for description purposes only, control bit 702 and increment bit 704 are described in the order as shown in FIGS. 8A and 8B.

One skilled in that art will appreciate that the present invention can be practiced by other than the embodiments described, which are present for purposes of illustration and not of limitation, and the present invention is limited only by the claims that follow.

What is claimed is:

1. In a Field Programmable Gate Array, a shift register for transferring data bits in a configuration bitstream to a programmable switching array, the shift register able to shift more than one bit per clock cycle, the shift register comprising:

M flip-flops connected in series, where M is an integer greater than two; and
data flow means, coupled to said flip-flops, having a first operation mode and a second operation mode, for:
(A) serially receiving one bit of the configuration bitstream and for transferring said configuration bitstream one bit at a time through said M flip-flops while in said first operation mode, and
(B) receiving N bits of the configuration bitstream and for transferring each bit of the configuration bitstream through said M flip-flops N bits at a time while in said second operation mode, where N is an integer greater than one and less than M.

2. The shift register of claim 1, wherein said data flow means is a plurality of multiplexers.

3. An apparatus for transferring a configuration bitstream from a data source to a Field Programmable Gate Array comprising:
a shift register, located on the Field Programmable Gate Array, operable to receive the configuration bitstream from the data source, means, coupled to the shift register,
(a) for receiving a signal having a first or second logic state from the data source,
(b) for enabling the shift register to receive N bits of the configuration bitstream in a clock cycle and for enabling each of the bits of the configuration bitstream received by the shift register to shift N bits per clock cycle when said signal is in said first logic state; and
(c) for enabling the shift register to receive one bit of the configuration bitstream in a clock cycle and for enabling each bit of the configuration bitstream received by the shift register to shift one bit per clock cycle when said signal is in said second logic state.

4. A method for reducing the size of a configuration bitstream for a Field Programmable Gate Array, comprising the steps of:
(a) receiving a configuration bitstream,
wherein said configuration bitstream is comprised of frames, wherein said frames include control bits, address bits and data bits, said data bits to be written into an address location in a switching array of the Field Programmable Gate Array at a location indicated by said address bits;

wherein said control bits of each frame have a compress bit, and wherein said compress bit has a first or a second logic state;

(b) receiving a frame of the configuration bitstream with said compress bit in said first logic state;

(c) writing data bits to an address location of said switching array specified by said address bits of said received frame;

(d) receiving a frame of the configuration bitstream with said compress bit in said second logic state;

(e) writing data bits, associated with the previous frame received when the compress bit was in said first logic state, to an address location in said switching array specified by said address bits of said received frame of step (d), wherein in said received frame of step (d) has no data bits.

5. The method of claim 4, wherein said control bits of each frame have an increment bit and wherein said increment bit has a first or a second logic state.

6. The method of claim 5, further comprising the steps of:

(f) receiving a frame of the configuration bitstream with said increment bit in said first logic state, (g) writing data bits of said received frame to an address of said switching array specified by said address bits;

(h) receiving a second frame of the configuration bitstream with said increment bit in said second logic state, (i) incrementing said address by a predetermined number; and (j) writing data bits of said second frame to said incremented address of said switching array, wherein said second frame of the configuration bitstream includes no address bits.

7. A method for reducing the size of a configuration bitstream for a Field Programmable Gate Array, comprising the steps of:

(a) receiving a configuration bitstream, wherein said configuration bitstream is comprised of frames, wherein said frames include control bits, address bits and data bits, said data bits to be written to an address in a switching array of the Field Programmable Gate Array at an address indicated by said address bits;

wherein said control bits of each frame have an increment bit, and wherein said increment bit has a first or a second logic state;

(b) receiving a frame of the configuration bitstream with said increment bit in said first logic state, (c) writing data bits of said received frame to an address of said switching array specified by said address bits;

(d) receiving a second frame of the configuration bitstream with said increment bit in said second logic state, (e) incrementing said address by a predetermined number; and (f) writing data bits of said second frame to said incremented address of said switching array, wherein said second frame of the configuration bitstream includes no address bits.

8. The method of claim 7, wherein said control bits of each frame have a compress bit, and wherein said compress bit has a first or a second logic state.

9. The method of claim 8, further comprising the steps of:

(g) receiving a frame of the configuration bitstream with said compress bit in said first logic state;

(h) writing data bits to an address location of said switching array specified by said address bits of said received frame;

(i) receiving a frame of the configuration bitstream with said compress bit in said second logic state; and (j) writing data bits, associated with the previous frame received when the compress bit was in said first logic state, to an address location in said switching array specified by said address bits of said received frame of step (i), wherein in said received frame of step (i) has no data bits.

* * * * *